(12) United States Patent
Novak

(10) Patent No.: US 6,980,279 B2
(45) Date of Patent: Dec. 27, 2005

(54) INTERFEROMETER SYSTEM FOR MEASURING A HEIGHT OF WAFER STAGE

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/764,377

(22) Filed: Jan. 22, 2004

(65) Prior Publication Data

US 2005/0162630 A1    Jul. 28, 2005

(51) Int. Cl.[7] .................. G03B 27/42; G03B 27/52; G03B 27/54
(52) U.S. Cl. ....................... 355/53; 355/55; 355/67
(58) Field of Search ...... 355/53, 55, 67; 356/399–401; 250/548

(56) References Cited

U.S. PATENT DOCUMENTS

| | | | |
|---|---|---|---|
| 4,999,669 A | | 3/1991 | Sakamoto et al. |
| 5,416,562 A | | 5/1995 | Ota et al. |
| 5,917,580 A | | 6/1999 | Ebinuma et al. |
| 6,020,964 A | * | 2/2000 | Loopstra et al. ............. 356/500 |
| 6,122,036 A | * | 9/2000 | Yamasaki et al. ............ 355/53 |
| 6,208,407 B1 | | 3/2001 | Loopstra |
| 6,285,457 B2 | * | 9/2001 | Ukaji ......................... 356/500 |

FOREIGN PATENT DOCUMENTS

EP    0 077 878 A1    4/1983
EP    0 793 073 A2    3/1997

OTHER PUBLICATIONS

Patent Abstracts of Japan, Publication No. 61-196532, *Exposure Device*, Tsukamoto Izumi, filed Feb. 26, 1985.
Patent Abstracts of Japan, Publication No. 57-183031, *Method For Wafer Exposure And Device Thereof*, Iwai Hiroshi, filed May 6, 1981.

* cited by examiner

*Primary Examiner*—Henry Hung Nguyen
(74) *Attorney, Agent, or Firm*—Beyer Weaver & Thomas LLP

(57) ABSTRACT

An interferometer system for measuring the height of a wafer stage utilizes four beams emitted horizontally parallel to one another and in a same direction from an interferometer and obtained by splitting a single laser beam. Two of these four beams are reference beams and the other two are measurement beams. The reference beams are mutually on opposite sides of the center point of the stage, equally separated therefrom horizontally, and are reflected back from the front surface of the stage. The wafer stage is provided with two mirrors inclined at 45° extending horizontally so as to reflect the measurement beams vertically upward. These two inclined mirrors are disposed in lower front and upper back parts of the stage and the two measurement beams are aimed and reflected at target points on them, diametrically opposite with reference to the center point of the stage. The height of the wafer stage is calculated from measured path lengths of these four beams, independent of small displacements to first degree in other linear and rotational degrees of freedom of motion of the wafer stage.

21 Claims, 7 Drawing Sheets

INTERFEROMETER SYSTEM FOR MEASURING A HEIGHT OF WAFER STAGE

BACKGROUND OF THE INVENTION

This invention is in the technical field of lithographic projection of a mask pattern on a wafer arranged on a wafer stage and relates in particular to an interferometer system for measuring the height of such a wafer stage for determining an ideal height for illuminating the wafer surface.

U.S. Pat. No. 6,208,407 has described such systems having a projection station and a measuring station. Each wafer, prior to having a pattern being illuminated in the projection station, is brought into a measuring station where not only is the wafer surface mapped to obtain its profile but also the height is measured of the stage on which the wafer is transported from the measuring station into the projection station and is exposed to a projection beam in the projection station. Wafer height sensors for this purpose have also been described in U.S. Pat. No. 6,208,407, making a horizontal measuring beam incident on a reference plane provided on the wafer stage. The reference plane is inclined by 45° and the vertically upwardly reflected light is reflected back by a horizontal mirror placed above such that the downwardly reflected light is again reflected on the reference plane to be returned to the sensor.

In the technical field of photolithography, it is known to split a single laser beam into a measurement and reference beams and combine them optimally to bring to a sensor and associated electronics for measurement of a relative displacement therebetween. U.S. Pat. No. 6,208,407 describes an arrangement with two height measuring beams, requiring interferometer optics and measurement beams on both sides of the stage. This makes it impractical for certain multistage systems where a second stage must pass the first stage on one side because one of the measurement beams incident on one stage will be blocked by the other stage.

It is desirable, therefore, to provide an interferometer system capable of measuring the height of a wafer stage even with small displacements to a first degree in other degrees of freedom and usable for a multistage system.

SUMMARY OF THE INVENTION

An interferometer system according to this invention may be broadly characterized as comprising a wafer stage and an interferometer positioned on one side of the wafer stage. The wafer stage has a chuck configured to hold a wafer and has two mirrors located at specified different positions on the wafer stage with respect to the chuck, and the interferometer is configured to generate and reflect at least two measuring beams off these mirrors respectively. A computation device is further provided for measuring the height of the wafer on the wafer table based on height information received from the reflected two measuring beams.

Explained more in detail, the interferometer system utilizes four beams emitted horizontally parallel to one another and in a same direction from an interferometer. Two of these four beams serve as reference beams and the other two are referred to as measurement beams for measuring the height of the wafer stage. The wafer stage itself is generally of a conventional design, being a generally rectangular parallelepiped and having a center point, a vertical front surface and a horizontal top surface with a front edge and a back edge which are parallel to the front surface.

The wafer stage is provided with two reference planes for the measurement of its height. The two mirrors placed thereon are herein referred to as the lower front mirror and the upper back mirror. They are both inclined at 45° extending horizontally so as to reflect an incident horizontal beam vertically upward, the former being disposed in front of the front edge and below the center point and the latter at the back edge and above the top surface. Downwardly facing horizontal mirrors are disposed above these inclined mirrors to reflect upwardly traveling light from these inclined mirrors straight downward.

The two reference beams are aimed at mutually opposite sides of and at a same horizontal distance from said center point and are reflected back by the front surface of the wafer stage. The two measurement beams are aimed and reflected at target points on the two inclined mirrors, these two target points being horizontally displaced from each other and symmetrical with respect to the center point. The reflections of these four beams are received by the interferometer and the height of the wafer stage is calculated from measured path lengths of these four beams. With the interferometer system thus arranged, vertical displacements of the wafer stage can be calculated independent of small displacements to first degree in other linear and rotational degrees of freedom of motion of the wafer stage.

BRIEF DESCRIPTION OF THE DRAWING

The invention, together with further objects and advantages thereof, may best be understood with reference to the following description taken in conjunction with the accompanying drawings in which.

Throughout herein, like or equivalent components are indicated by the same symbols and not repetitiously explained even where they are components of systems according to different embodiments of the invention.

DETAILED DESCRIPTION OF THE INVENTION

Figure 4A:
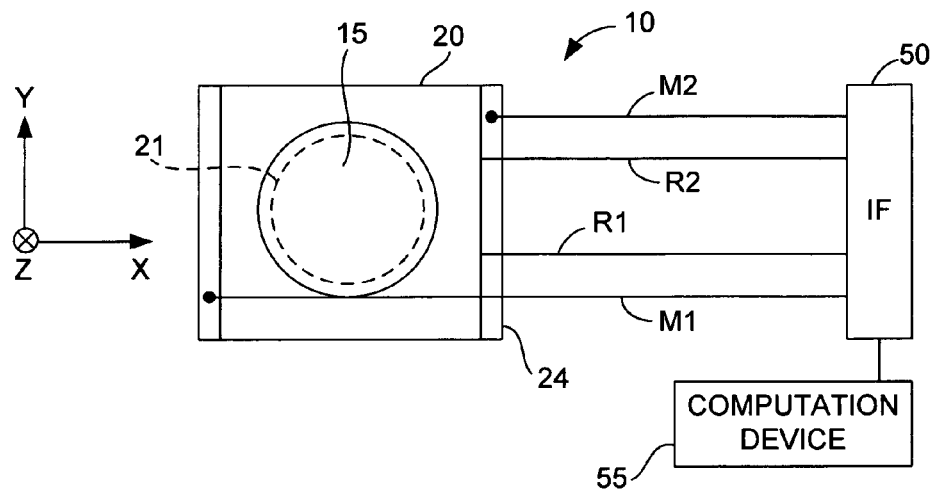
FIGS. 4A, 4B and 4C, together referred to as FIG. 4, are respectively a top view, a horizontal side view and a horizontal front view, schematically drawn, of an interferometer system embodying this invention.

FIG. 4 shows schematically an interferometer system 10 embodying this invention, showing a wafer stage 20 carrying a wafer 15 on top. The wafer stage 20 is generally of the shape of a rectangular parallelopiped with a horizontal flat top surface 22, extending from a front edge to a back edge and being provided with a chuck 21 for placing the wafer 15 thereon, and a vertical flat front surface 24. For the convenience of description, a rectangular coordinate system is defined as shown with the Z-axis in the vertical direction, the X-axis as being perpendicular to the front surface 24, and the Y-axis as being perpendicular to both the X-axis and the Z-axis. Thus, in the language of this coordinate system, the purpose of this invention is to measure the displacement of the wafer stage 20 accurately in the Z-direction, as independently as possible, or at least to the first order, of its small displacements in the other degrees of freedom, that is, the linear displacements in the X-direction and the Y-direction and the angular displacements $\Theta_x$, $\Theta_y$ and $\Theta_z$ around the X-axis, Y-axis and the Z-axis. Numeral 25 indicates a space-fixed point indicative of a "center point" of the stage 20. It is normally the center of gravity of the stage 20 but is intended to represent the position around which the stage 20 is mostly likely to undergo angular displacements of which the effects are herein intended to minimize. The wafer 15 is usually placed directly above such center point 25, although this is not intended to limit the scope of the invention as this "center point" may be any point in space. It is to be noted that the "center point" 25 is not a fixed point in the stage 20 because it can move relative to the stage 20 when, for example, the stage 20 undergoes a translational motion in the Y-direction.

An interferometer (IF) 50 is adapted (as commonly done in the lithography stage art) to split a single laser beam into four beams. Two of these four beams are herein referred to as measurement beams M1 and M2 and the remaining two are herein referred to as reference beams R1 and R2, all four of these beams are emitted mutually parallel in the X-direction towards the front surface 24 of the stage 20. The two reference beams R1 and R2 are reflected back from the front surface 22 of the stage 20 to the interferometer 50 and may be mathematically combined to represent a total reference distance $(D_{R1}+D_{R2})$ in the X-direction. The average height of R1 and R2 is equal to the height of the "center point" 25. It is to be noted that geometrical distances, as opposed to optical path lengths, will be referred to when various "distances" are mentioned.

Figure 4B:
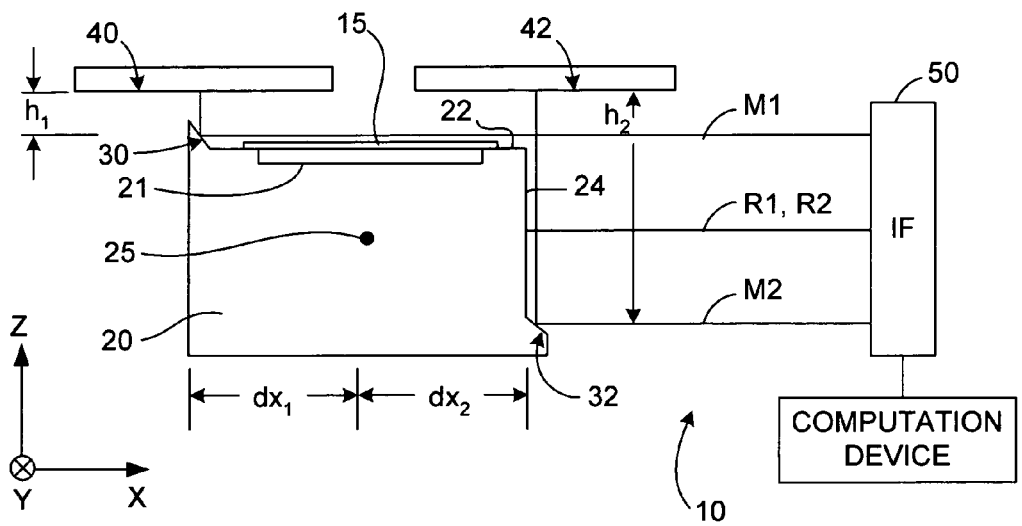
Figure 4C:
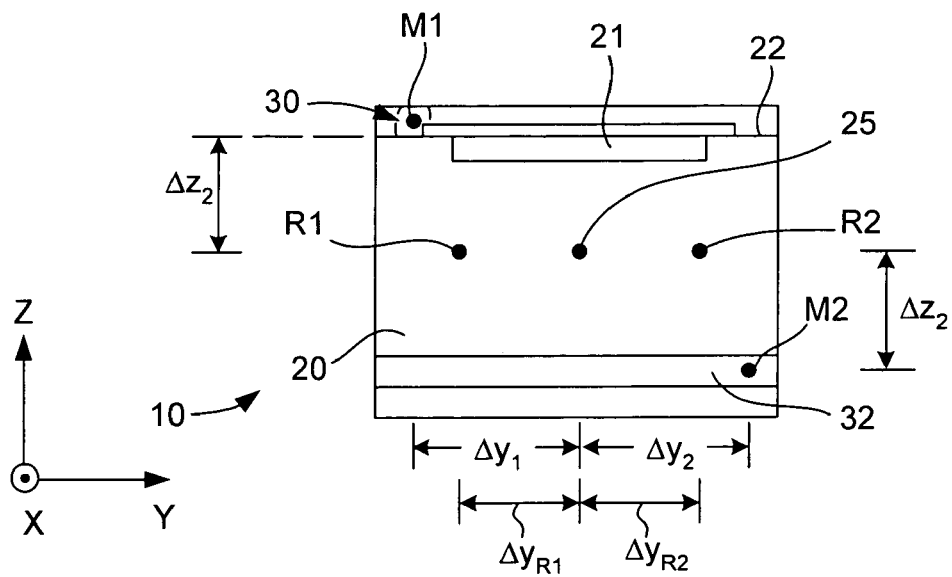

For the measurement of height, two inclined mirrors 30 and 32 at inclining angles of 45° relative to the top surface 22 are provided on the stage 20 and horizontal mirrors 40 and 42 are provided respectively above these inclined mirrors 30 and 32. One of the inclined mirrors (30) is attached to the top surface 22 on the back edge of the stage 20 extending in the Y-direction and is hereinafter referred to as the upper back mirror. The other of the inclined mirrors (32) is attached to the front surface 24 at a lower edge of the stage 20 extending in the Y-direction and is hereinafter referred to as the lower front mirror. They are attached such that the center point 25 is approximately at the average height of these two inclined mirrors 30 and 32, as shown in FIG. 4C.

One of the measurement beams (M1) is horizontally projected onto the upper back mirror 30, passing above the wafer 15 on top of the top surface 22 of the stage 20 and makes a 90° reflection vertically upward towards the horizontal mirror 40 overhead, returning back along the initial path to the interferometer 50. Likewise, the other of the measurement beams (M2) is horizontally made incidence onto the lower front mirror 32 and makes another 90° reflection vertically upward towards the horizontal mirror 42 overhead, returning back along the initial path to the interferometer 50. The distance measured by these two measurement beams M1 and M2 can be mathematically combined to represent a total measurement distance $(D_{M1}+h_1)+(D_{M2}+h_2)$ where $D_{M1}$ and $D_{M2}$ represent the horizontal portions of the path lengths of the beams M1 and M2 and $h_1$ and $h_2$ represent their vertical portions, as indicated in FIG. 4B.

The reference distance is subtracted from the measurement distance to obtain a measurement of the vertical displacement of the stage 20. This subtraction is preferably done optically for high speed and mathematical precision. The primary object of the measurement is to determine the change in height of the stage 20 with a wafer. In this example, a change in stage height $\Delta h$ measured over the center point 25 is given as follows:

$$\Delta h=\{(D_{M1}+h_1)+(D_{M2}+h_2)-(D_{R1}+D_{R2})\}/2-h_0$$

where $h_0$ is the value of the expression at the time of initialization. This expression can be rearranged as follows:

$$\Delta h=\{(D_{M1}-D_{R1})+(D_{M2}-D_{R2})+(h_1+h_2)\}/2-h_0.$$

If $h_0$ is defined as the average of $h_1$ and $h_2$, or $h_0=(h_1+h_2)/2$, $\Delta h$ is determined by the following simpler expression:

$$\Delta h=\{(D_{M1}-D_{R1})+(D_{M2}-D_{R2})\}/2.$$

The measurement and reference beams can be combined optically by using known techniques to directly yield $(D_{M1}-D_{R1})$ and $(D_{M2}-D_{R2})$ such that $\Delta h$ can be obtained as the average of these two numbers. This makes the calculation simple and easy to perform at high speed. In FIG. 4, a computation device for measuring the height of the wafer 15 on the wafer stage 20 based on the height information obtained from the measuring beams received by the interferometer 50 is indicated schematically at 55.

One of characteristic features of this invention is that the stage 20 is provided with two inclined mirrors at different heights. For convenience, they can be also mutually displaced along the X-direction. This allows for two height-measuring beams, one on each side of the stage 20, diagonally opposed with respect to the center point 25, both beams coming towards the stage 20 from the same direction.

Another characteristic feature of this invention is that the measurement beams and the reference beams are arranged such that the stage height can be measured with the measurement being independent of linear displacements of the stage 20 in the X- and Y-directions and also of small rotational displacements in the $\Theta_x$, $\Theta_y$ and $\Theta_z$ directions around the X-, Y- and Z-axes. FIG. 4 shows an example wherein the two reference beams R1 and R2 are at the same height, but this is not a required condition of the invention. According to the invention, the two reference beams R1 and R2 are required to be diametrically opposite to each other with respect to the center point 25. One of the consequences of this requirement is that the two reference beams R1 and R2 are at a same horizontal distance (in the Y-direction because these beams are in the X-direction) from the center point 25. In terms of the symbols used in FIG. 4C, this is expressed as $\Delta y_{R1}=\Delta y_{R2}$.

Similarly, as shown in FIG. 4, the two measurement beams M1 and M2 are emitted from the interferometer 50 so as to be reflected off the inclined mirrors 30 and 32, respectively, at positions that are diametrically opposite to each other with respect to and at the same distance from the center point 25. In terms of the symbols used in FIG. 4, this is expressed as $\Delta x_1=\Delta x_2$, $\Delta y_1=\Delta y_2$ and $\Delta z_1=\Delta z_2$.

Thus, for a small rotation $\Theta_y$ and/or $\Theta_z$ about the center point 25, the change in R1 is equal to and opposite of that in R2 such that the net change is zero. A rotation $\Theta_x$ around the X-axis and linear displacements along the Y- and Z-axes produce no change in R1+R2 because these displacements are all in the plane of the front surface 24 of the stage 20.

It is similar with the measurement beams M1 and M2. For a small rotation $\Theta_y$ and/or $\Theta_z$ about the center point 25, the corresponding changes in M1 and M2 are equal and opposite, producing no net change in Δh. For a small rotation $\Theta_x$ around the X-axis, the change in distance $h_1$ and that in distance $h_2$ are equal and opposite to each other, again producing no net change. For a translational displacement in the Y-direction, there is no change because the displacement is in the planes of the reflecting mirrors 30 and 32. For a translational displacement in the X-direction, the measurement beams M1 and M2 change at the same rate as the reference beams R1 and R2, that is, $\{(D_{M1}+h_1)+(D_{M2}+h_2)-(D_{R1}+D_{R2})\}$ does not change.

Figure 5:
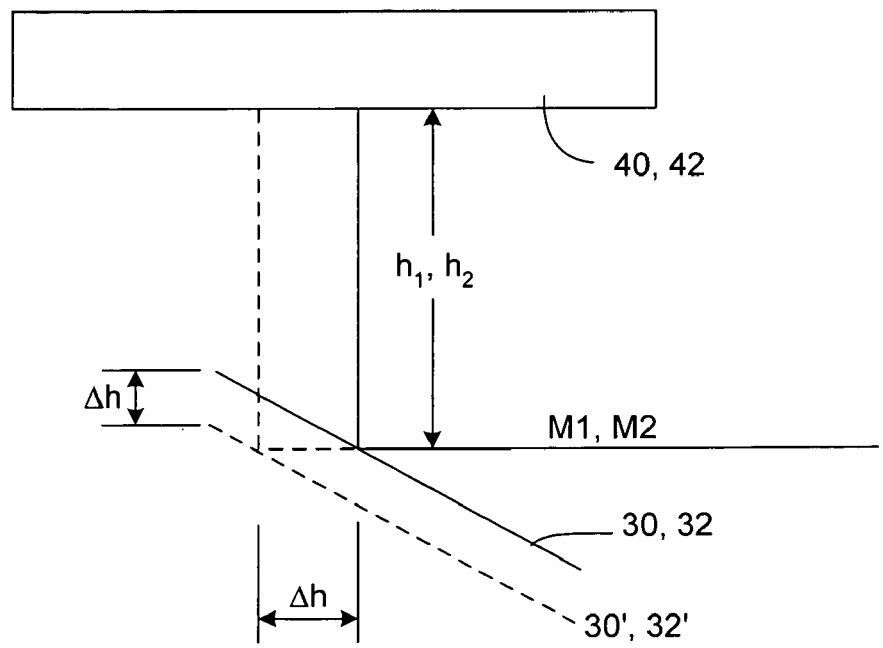
FIG. 5 is a diagram showing the effects of measurement change as the stage is linearly displaced vertically.

As for a small change in stage height in the Z-direction, the value of the expression for Δh is a measure of the stage height change since M1 and M2 each change at the same rate as Δh, and the other terms stay constant. This is illustrated in FIG. 5 where the position of either of the inclined mirrors 30 or 32 before the displacement is shown by solid lines and their positions 30' and 32' after a vertical displacement of the stage 20 by Δh is shown by broken lines. FIG. 5 shows that as the stage is moved vertically by Δh, the paths of M1 and M2 also increase in length by Δh while the path lengths $h_1$ and $h_2$ remain constant.

Figure 6A:
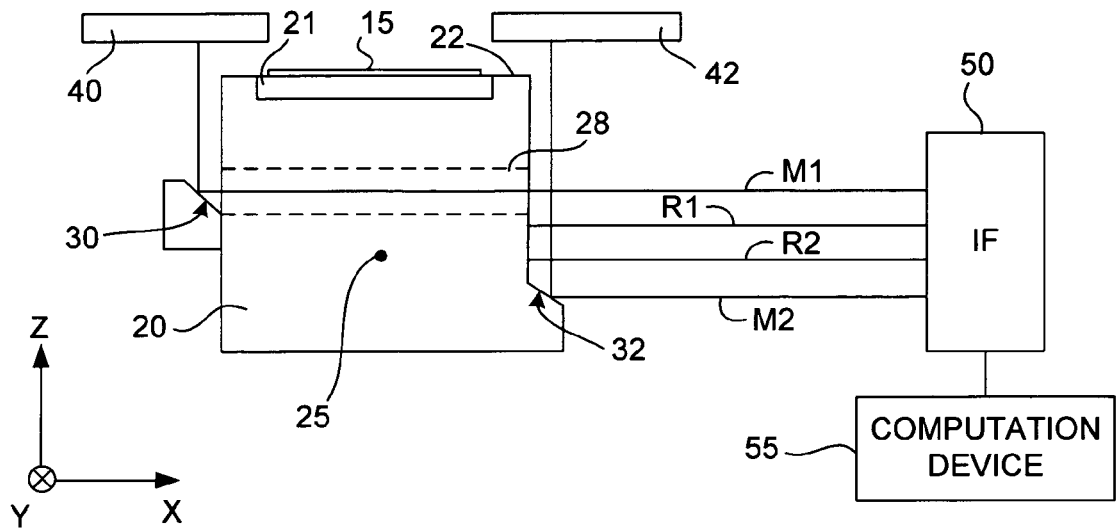
FIGS. 6A and 6B, together referred to as FIG. 6, are respectively a horizontal side view and a horizontal front view, schematically drawn, of another interferometer system embodying this invention.
Figure 6B:
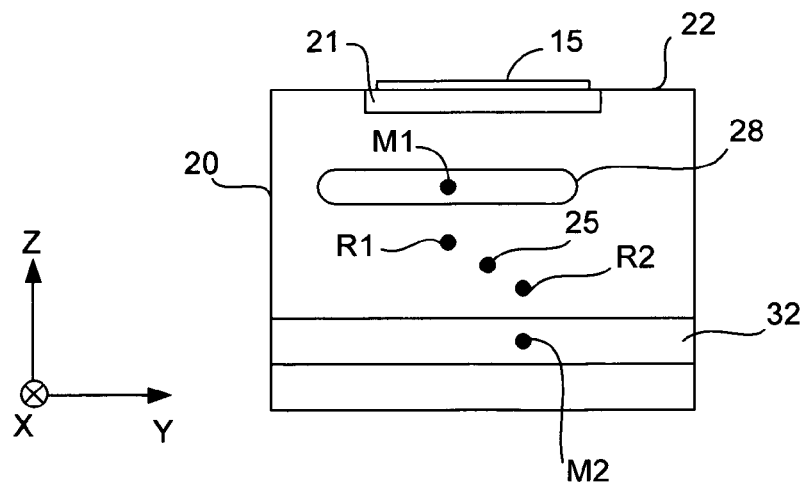

FIG. 6 shows another interferometer system embodying this invention, using the same symbols as used in FIG. 4 to indicate like or equivalent components. This embodiment is similar to the one described above with reference to FIG. 4 but is different therefrom in that the upper measurement beam M1 does not pass above the wafer 15 on top of the top surface 22 of the wafer stage 20. The wafer stage 20 in provided with a throughhole 28 extending in the direction of the X-axis below the chuck 21 at the top surface 22 of the wafer stage 20. One of the inclined mirrors (the higher one (30) according to the illustrated example) is accordingly positioned at the same height as the throughhole 28, serving to reflect the upper measurement beam M1 upwards towards the horizontal mirror 40 mirror above. As shown in is FIG. 6B, the two measurement beams M1 and M2 and the two reference beams R1 and R2 are both symmetrically located with respect to a same center point 25, similarly to the arrangement shown in FIG. 4. This embodiment is advantageous in that care need not be taken in order to pass the upper measurement beam M1 above the upper surface of the wafer 15.

In summary, with the measurement beams M1 and M2 and the reference beams R1 and R2 arranged as explained above, the height of a point within the stage 20 can be measured by an interferometer system with a signal that is only dependent on this height, not influenced to first order by translational displacements along the X-axis or the Y-axis or rotational displacements around the X-, Y- or Z-axis.

Figure 1:
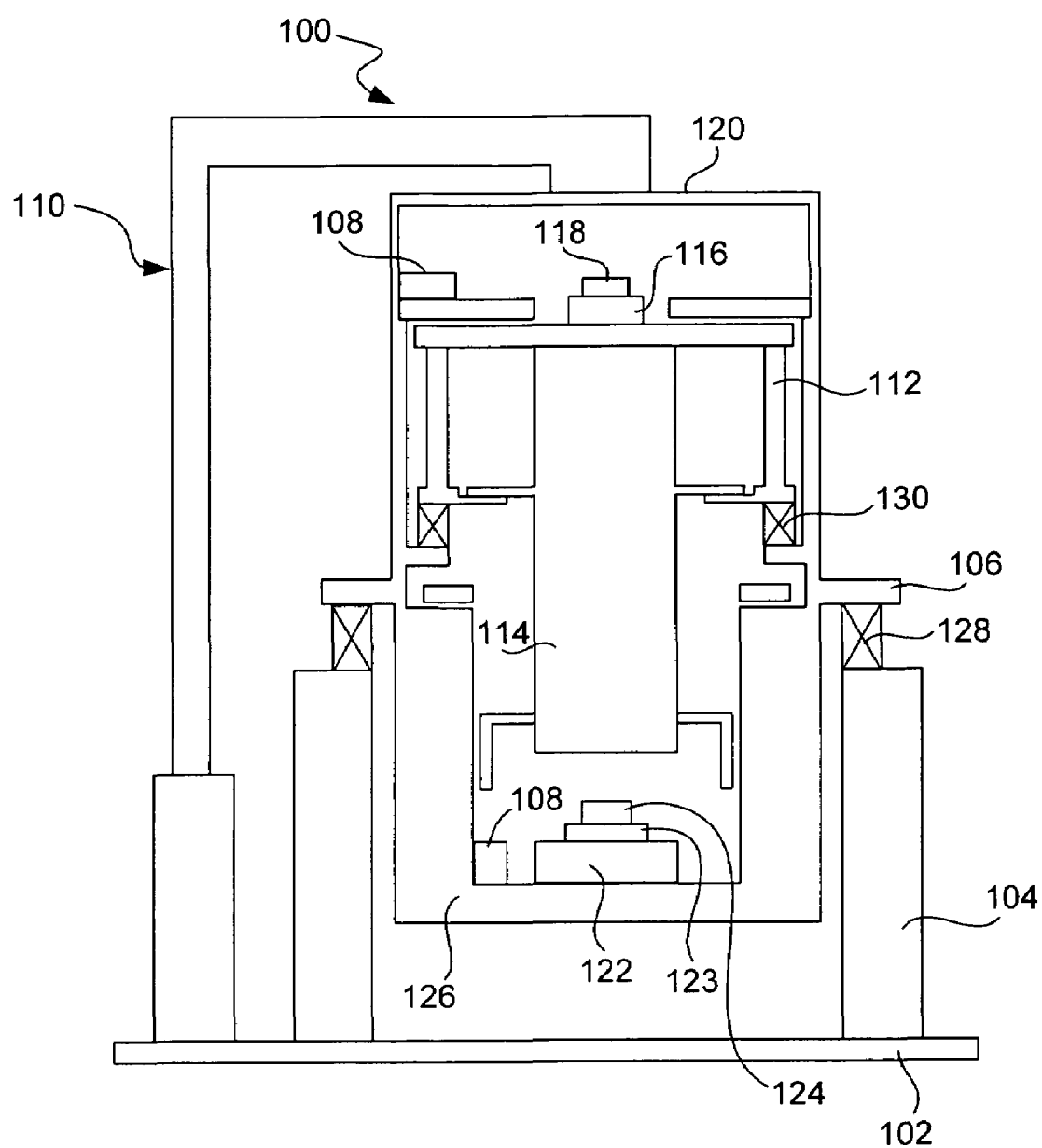
FIG. 1 is a cross-sectional schematic view of a lithographic exposure apparatus incorporating a projection apparatus of this invention.

FIG. 1 shows a typical lithographic exposure apparatus 100 incorporating the interferometer system of this invention, comprising a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding the reticle stage 116, a wafer stage 122, a wafer table 123 for retaining a semiconductor wafer workpiece 124, and a lower enclosure 126 surrounding the wafer stage 122.

The support frame 104 typically supports the base frame 106 above the mounting base 102 through a base vibration isolation system 128. The base frame 106 in turn supports, through an optical vibration isolation system 130, the optical frame 112, the measurement system 108, the reticle stage 116, the upper enclosure 120, the optical device 114, the wafer stage 122, the wafer table 123 and the lower enclosure 126 above the base frame 106. The optical frame 112 in turn supports the optical device 114 and the reticle stage 116 above the base frame 106 through the optical vibration isolation system 130. As a result, the optical frame 112, the components supported thereby and the base frame 106 are effectively attached in series through the base vibration isolation system 128 and the optical vibration isolation system 130 to the mounting base 102. The vibration isolation systems 128 and 130 are designed to damp and isolate vibrations between components of the exposure apparatus 100 and comprise a vibration damping device. The measurement system 108 monitors the positions of the stages 116 and 122 (and/or the wafer table 123) relative to a reference such as the optical device 114 and outputs position data to the control system. The measurement system 108 can include a laser interferometer system for measuring the position (displacement) of the stages 116 and 122, and the wafer table 123 in three degrees (X-axis, Y-axis, Z-axis) about three degrees ($\theta_x$, $\theta_y$, $\theta_z$). For measuring the position (displacement) along the Z-axis, the interferometer system of this invention as shown in FIGS. 4–6 can be utilized. The optical device 114 typically includes a lens assembly that projects and/or focuses the light or beam from the illumination system 110 that passes through the reticle 118. The reticle stage 116 is attached to one or more movers (not shown) directed by the control system to precisely position the reticle 118 relative to the optical device 114. Similarly, the wafer stage 122 includes one or more movers (not shown) to precisely position the wafer workpiece 124 with the wafer table 123 relative to the optical device (lens assembly) 114.

Figure 7:
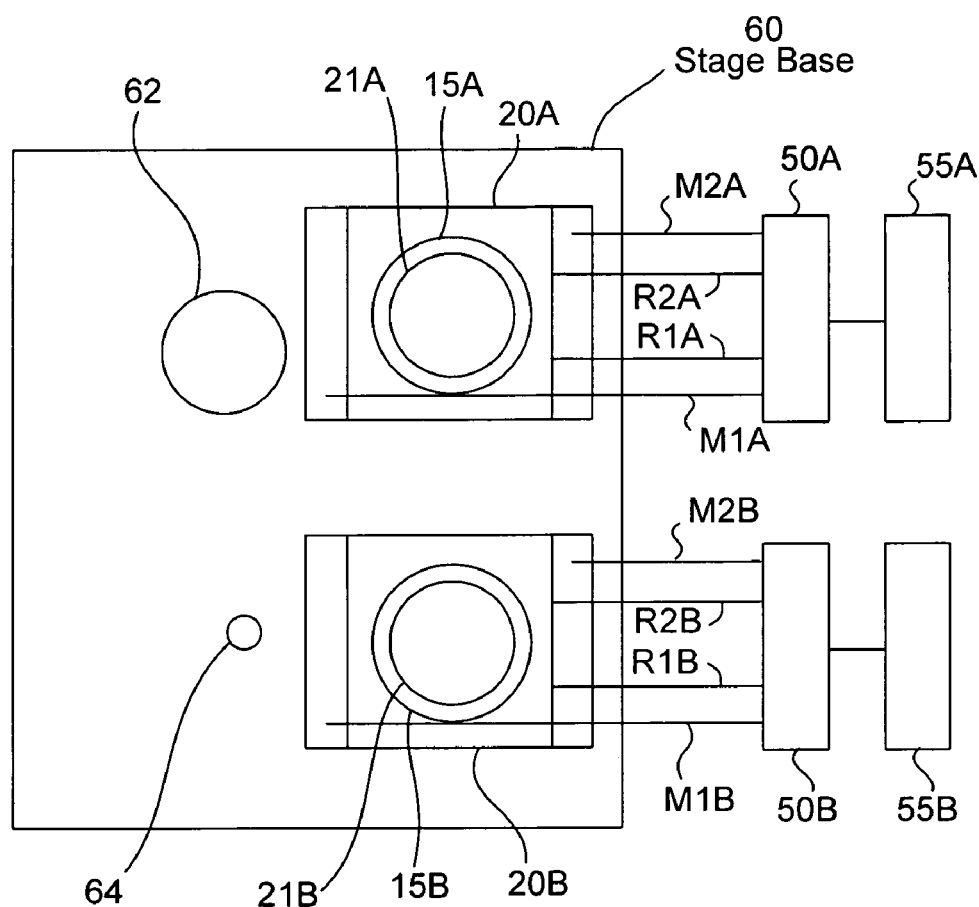
FIG. 7 is a top view of still another interferometer system embodying this invention characterized as having two wafer stages.

Recently, in order to increase the throughput of the exposure apparatus, wafer stage assemblies have been developed that include two wafer stages. In this design, as disclosed in U.S. patent application Publication US2002/0117109A1 published Aug. 29, 2002, each wafer stage retains a wafer. Further, each wafer stage independently and alternately moves one of the wafers into an "operational area" for processing the wafers. Typically, the wafer stage assembly includes a wafer stage base and a wafer mover assembly that precisely positions the wafer stages relative to the wafer stage base. FIG. 7 shows still another interferometer system embodying this invention suitable for such a wafer stage assembly as disclosed in aforementioned U.S. patent application Publication US2002/0117109A1.

The interferometer system shown in FIG. 7 may be characterized in simple terms as comprising two of the systems as described above with reference to FIGS. 4A and 4B and hence each of the components that is similar or equivalent to one of those which have been shown in FIGS. 4A and 4B will be indicated by the same numeral followed by letter A or B and may not repetitiously explained. Explained more in detail, FIG. 7 shows a system having two wafer stages 20A and 20B placed on the top surface of a stage base 60 in a side-by-side relationship, each supporting a wafer 15A or 15B by means of a chuck 21A or 21B. Two interferometers 50A and 50B, each connected to a computation device 55, are disposed also in a side-buy-side relationship such that measurement beams M1A and M2A and reference beams R1A and R2A from one of the interferometers (50A) and measurement beams M1B and M2B and reference beams R1B and R2B from the other interferometers (50B) are all emitted in the same direction. In other words, the two interferometers 50A and 50B are positioned on the same side against the two wafer stages 20A and 20B.

In FIG. 7, numerals 62 and 64 figuratively indicate respectively an exposure device and an alignment device as examples of aforementioned operational areas.

The exposure apparatus 100 can include multistage systems for the wafer stage 122. In this case, the measurement system 108 for measuring the height (position or displacement in the Z-direction) of the multi stages can include two interferometer systems that are positioned on the same side of the multi stages.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternatively, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
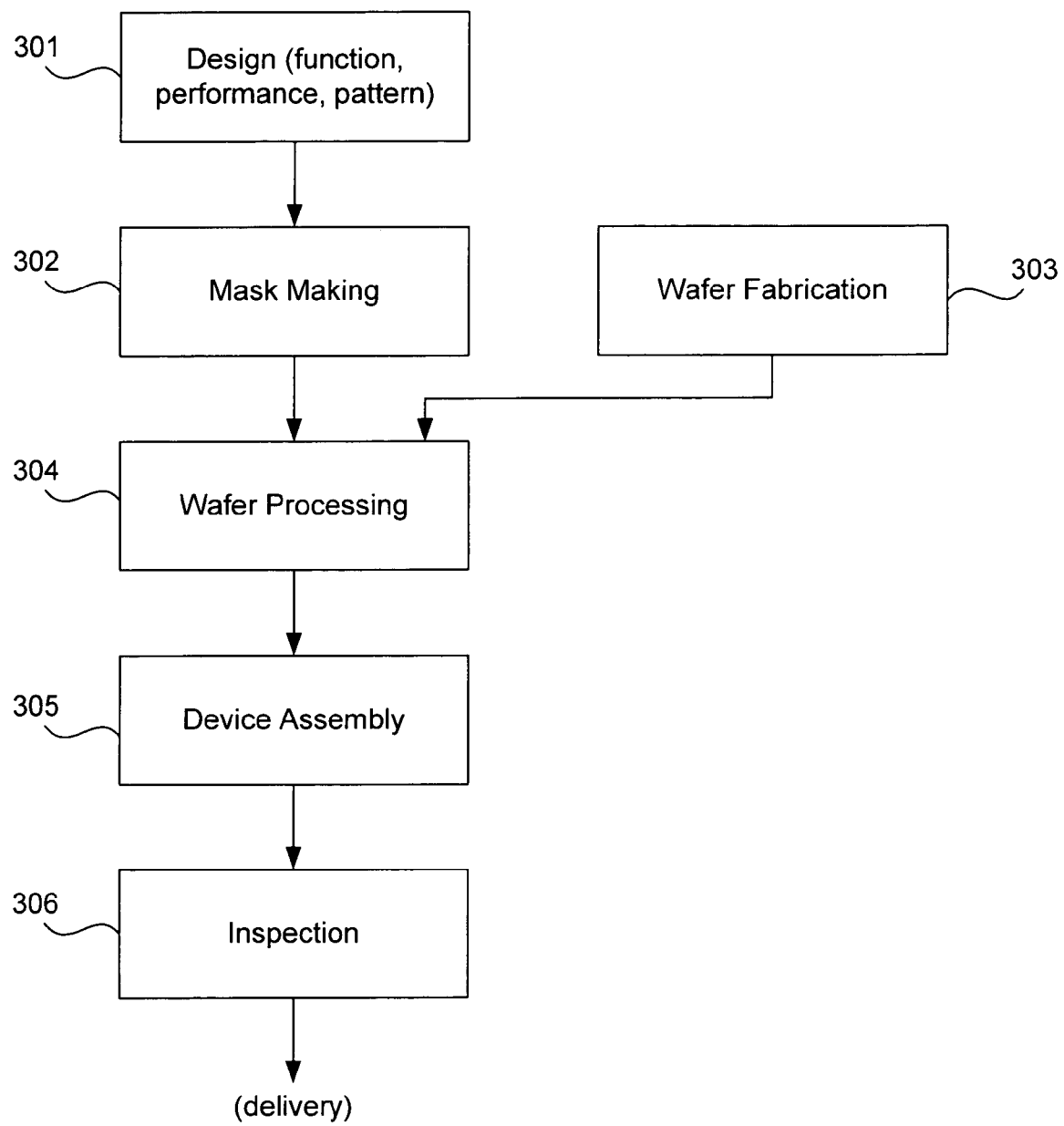
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
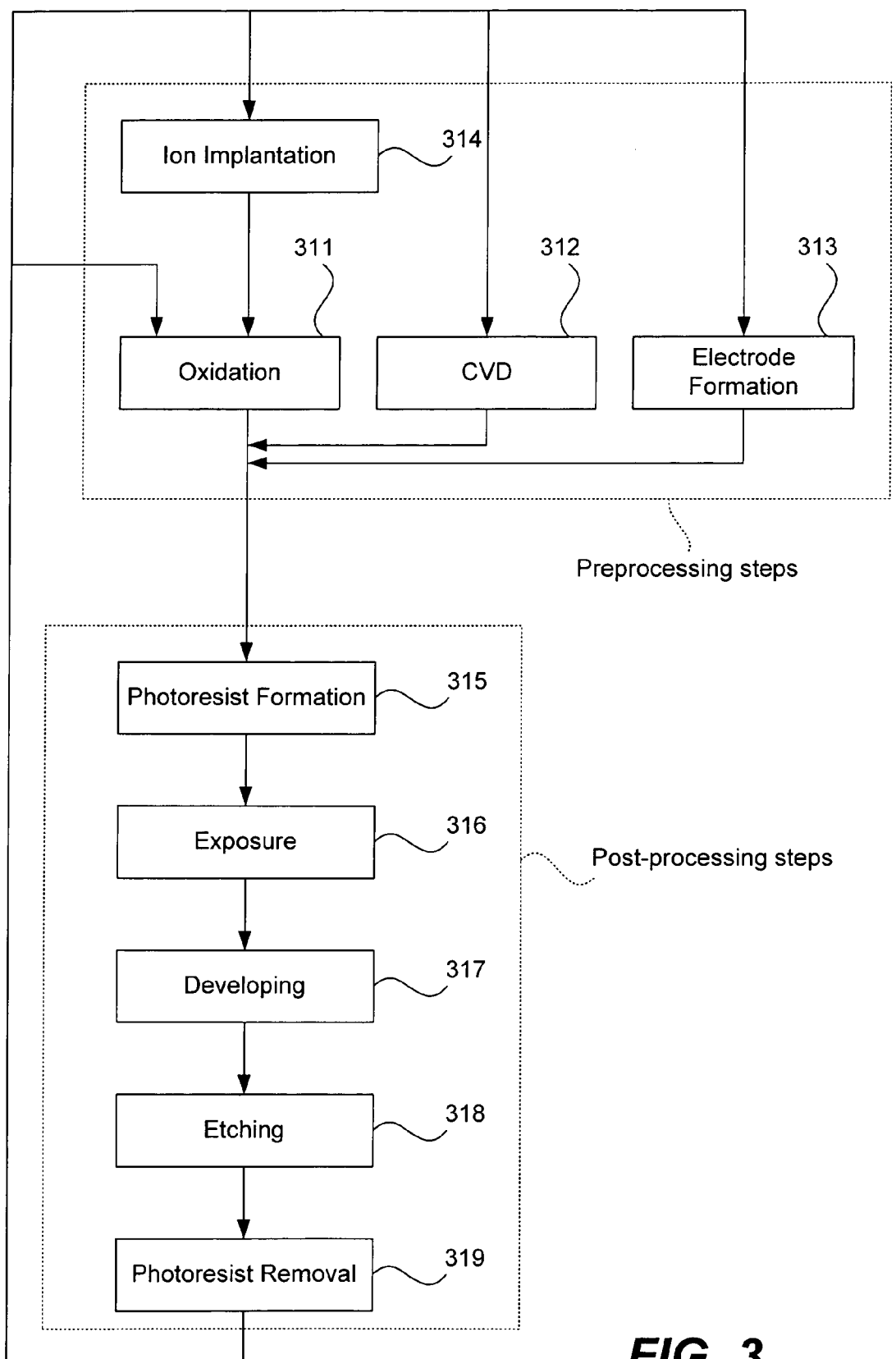
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

Although the invention was described above with reference to only a limited number of examples, they are not intended to limit the scope of the invention. Many modifications and variations are possible within the scope of the invention. For example, as is well known, the interferometer 50 may include optics such as a corner cube to reverse the direction of the measurement and reference beams in such a way as to reduce the effect of stage rotation on signal strength, allowing a greater rotation angle over which a usable signal may be obtained. Such modifications and variations that may be apparent to a person skilled in the art are intended to be within the scope of this invention. It should be clear that assemblies as disclosed in aforementioned U.S. Pat. No. 6,208,407 and U.S. Patent Application Publication US2002/0117109A1 can be utilized at least in a part of the exposure apparatus of this invention.

What is claimed is:

1. An apparatus, comprising:
   a wafer stage having a wafer chuck configured to hold a wafer, the wafer stage having a first mirror and a second mirror located at different heights and different horizontal positions on the wafer stage and facing the same direction;
   an interferometer positioned on one side of the wafer stage, the interferometer configured to generate and reflect at least two measuring beams off the first and second mirrors on the wafer stage respectively; and
   a computation device configured to measure the height of a wafer on the wafer chuck based on height information received from the reflected two measuring beams.

2. The apparatus of claim 1, wherein the interferometer is further configured to generate first and second reference beams and to cause the first and second reference beams to be reflected off the wafer stage such that two height measurement data points are optically generated by combining the first reference reflected beam from the first reflected measurement beam and the second reference reflected beam from the second reflected beam respectively.

3. The apparatus of claim 2, wherein the computation device computes the height of the wafer on the wafer chuck from the two optically generated height measurement data points.

4. The apparatus of claim 3, wherein the first reference beam and the second reference beam are reflected off the wafer stage at positions that are on mutually opposite sides of the center of said wafer stage, and wherein the two measuring beams are aimed and reflected at target points each on the first mirror and the second mirror, said target points being horizontally displaced from each other and symmetrical with respect to said center.

5. The apparatus of claim 1, wherein the first mirror is located on a first side of the wafer stage adjacent the interferometer and the second mirror is located on a second side opposite the first side on the wafer stage, both said first mirror and said second mirror facing said interferometer.

6. The apparatus of claim 1, wherein the first mirror and the second mirror are positioned at 45 degree angles with respect to the two measuring beams respectively.

7. The apparatus of claim 2, wherein the two height measurement data points are optically generated by subtracting the first and second reference reflected beams from the first and second measurement beams respectively.

8. A method of measuring a vertical displacement of a wafer stage having a wafer chuck configured to hold a wafer, said method comprising the steps of:
   providing said wafer stage with a first mirror and a second mirror located at specified different heights and different horizontal positions on the wafer stage with respect to the wafer chuck, said first mirror and said second mirror facing the same direction;
   positioning an interferometer on one side of the wafer stage, the interferometer configured to generate and reflect at least two measuring beams off the first and second mirrors on the wafer stage respectively; and
   measuring the height of a wafer on the wafer chuck by means of a computation device based on height information received from the reflected two measuring beams.

9. A lithography system for projecting a pattern on a wafer by a projection beam by preliminarily determining a surface profile of the wafer on a stage and subsequently introducing the stage with the wafer into the projection beam, said lithographic system comprising:
- an illumination source;
- an optical system;
- a reticle stage arranged to retain a reticle;
- a wafer stage having a wafer chuck configured to hold a wafer, the wafer stage having a first mirror and a second mirror located at specified different heights and different horizontal positions on the wafer stage with respect to the wafer chuck, said first mirror and said second mirror facing the same direction;
- an interferometer positioned on one side of the wafer stage, the interferometer configured to generate and reflect at least two measuring beams off the first and second mirrors on the wafer stage respectively; and
- a computation device configured to measure the height of a wafer on the wafer chuck based on height information received from the reflected two measuring beams.

10. The lithography system of claim 9, wherein the interferometer is further configured to generate first and second reference beams and to cause the first and second reference beams to be reflected off the wafer stage such that two height measurement data points are optically generated by combining the first reference reflected beam from the first reflected measurement beam and combining the second reference reflected beam from the second reflected beam respectively.

11. The lithography system of claim 10, wherein the computation device computes the height of the wafer on the wafer chuck from the two optically generated height measurement data points.

12. The lithography system of claim 11, wherein the first reference beam and the second reference beam are reflected off the wafer stage at positions that are on mutually opposite sides of the center of said wafer stage, and wherein the two measuring beams are aimed and reflected at target points each on the first mirror and the second mirror, said target points being horizontally displaced from each other and symmetrical with respect to said center.

13. The lithography system of claim apparatus of claim 9, wherein the first mirror is located on a first side of the wafer stage adjacent the interferometer and the second mirror is located on a second side opposite the first side on the wafer stage, both said first mirror and said second mirror facing said interferometer.

14. The lithography system of claim 9, wherein the first mirror and the second mirror are positioned at 45 degree angles with respect to the two measuring beams respectively.

15. The lithography system of claim 10, wherein the two height measurement data points are optically generated by subtracting the first and second reference reflected beams from the first and second measurement beams respectively.

16. The lithography system comprising two sets of wafer stage and interferometer as each recited in claim 9, wherein both of the interferometers are positioned on a same side of the wafer stages.

17. An apparatus comprising:
- a stage that is movable in at least one direction, the stage having a first mirror and a second mirror located at different heights and different horizontal positions on the stage, said first mirror and said second mirror facing in the same direction;
- an interferometer positioned away from the stage and facing one side of the stage, the interferometer configured to generate and reflect at least two measuring beams off the first and second mirrors on the stage respectively; and
- a computation device connected to the interferometer, the computation device being configured to determine information related to the position of the stage along said one direction based on information received from the reflected two measuring beams.

18. An object manufactured with the lithography system of claim 9.

19. A wafer on which an image has been formed by the lithography system of claim 9.

20. A method for making an object using a lithography process, wherein the lithography process utilizes a lithography system as recited in claim 9.

21. A method for patterning a wafer using a lithography process, wherein the lithography process utilizes a lithography system as recited in claim 9.

* * * * *